(12) United States Patent
Greene et al.

(10) Patent No.: US 11,671,099 B2
(45) Date of Patent: Jun. 6, 2023

(54) LOGIC CELL FOR PROGRAMMABLE GATE ARRAY

(71) Applicant: Microchip Technology Inc., Chandler, AZ (US)

(72) Inventors: Jonathan W. Greene, Palo Alto, CA (US); Marcel Derevlean, Barsinghausen (DE)

(73) Assignee: Microchip Technology Inc., Chandler, AZ (US)

( * ) Notice: Subject to any disclaimer, the term of this patent is extended or adjusted under 35 U.S.C. 154(b) by 0 days.

(21) Appl. No.: 17/529,522

(22) Filed: Nov. 18, 2021

(65) Prior Publication Data

US 2022/0376693 A1 Nov. 24, 2022

Related U.S. Application Data

(60) Provisional application No. 63/191,774, filed on May 21, 2021.

(51) Int. Cl.
*H03K 19/17736* (2020.01)
*H03K 19/17728* (2020.01)
*H03K 19/21* (2006.01)

(52) U.S. Cl.
CPC .. *H03K 19/17728* (2013.01); *H03K 19/17736* (2013.01); *H03K 19/21* (2013.01)

(58) Field of Classification Search
CPC ....... H03K 19/17728; H03K 19/17736; H03K 19/21
See application file for complete search history.

(56) References Cited

U.S. PATENT DOCUMENTS

| 4,873,459 A | 10/1989 | Gamal et al. |
| 4,910,417 A | 3/1990 | Gamal et al. |
| 5,017,813 A | 5/1991 | Galbraith et al. |
| 5,055,718 A | 10/1991 | Galbraith et al. |
| 5,095,228 A | 3/1992 | Galbraith et al. |
| 5,132,571 A | 7/1992 | McCollum et al. |
| 5,191,241 A | 3/1993 | McCollum et al. |

(Continued)

OTHER PUBLICATIONS

"Virtex-4 FPGA User Guide", UG070 (v2.6), Xilinx, Inc., San Jose, CA, Dec. 1, 2008.

(Continued)

*Primary Examiner* — Kurtis R Bahr
(74) *Attorney, Agent, or Firm* — Glass and Associates; William D. Davis; Kenneth Glass

(57) ABSTRACT

A logic cell for a programmable logic integrated circuit apparatus includes a K-input lookup table (LUT) circuit having a primary output Y, wherein Y is any function of K inputs, and at least one additional output (F). A carry circuit receives the outputs of the LUT and a carry-in input CI. The carry circuit generates a sum output S and a carry-out output CO. The carry circuit can be configured to provide S=CI and select CO from the set {0, 1, F}. The carry circuit can alternatively be configured to provide S=EXOR(Y, CI) and select CO from the set {0, 1, F}. The carry circuit can alternatively be configured to provide S=EXOR(Y, CI) and CO=CI if Y=q or to select CO from the set {0, 1, F} if Y≠q, where q is a pre-determined value (e.g., such as 0 or 1).

19 Claims, 9 Drawing Sheets

(56) References Cited

U.S. PATENT DOCUMENTS

| | | | |
|---|---|---|---|
| 5,198,705 A | | 3/1993 | Galbraith et al. |
| 5,440,245 A | | 8/1995 | Galbraith et al. |
| 5,610,534 A | | 3/1997 | Galbraith et al. |
| 5,724,276 A | * | 3/1998 | Rose .............. G06F 7/5057 |
| | | | 708/700 |
| 5,781,033 A | | 7/1998 | Galbraith et al. |
| 7,185,035 B1 | * | 2/2007 | Lewis .............. G06F 7/501 |
| | | | 708/235 |
| 7,268,584 B1 | | 9/2007 | Cashman et al. |
| 7,372,296 B2 | * | 5/2008 | Sood .............. H03K 19/177 |
| | | | 326/38 |
| 7,430,137 B2 | | 9/2008 | Greene et al. |
| 7,463,061 B1 | | 12/2008 | Greene et al. |
| 7,804,321 B2 | | 9/2010 | Greene et al. |
| 7,816,946 B1 | | 10/2010 | Hecht et al. |
| 7,884,640 B2 | | 2/2011 | Greene et al. |
| 7,919,977 B2 | | 4/2011 | Greene et al. |
| 7,932,744 B1 | | 4/2011 | Greene et al. |
| 7,932,745 B2 | | 4/2011 | Hecht et al. |
| 8,352,532 B1 | * | 1/2013 | Kostarnov .............. G06F 7/5324 |
| | | | 708/628 |
| 8,415,650 B2 | | 4/2013 | Greene et al. |
| 8,447,798 B2 | * | 5/2013 | Langhammer .............. G06F 17/10 |
| | | | 708/235 |
| 8,981,328 B2 | | 3/2015 | Greene et al. |
| 9,000,807 B2 | | 4/2015 | Greene et al. |
| 9,103,880 B2 | | 8/2015 | Greene et al. |
| 9,147,836 B2 | | 9/2015 | Greene et al. |
| 9,514,804 B2 | | 12/2016 | Greene |
| 9,991,894 B2 | | 6/2018 | Greene et al. |
| 10,256,822 B2 | | 4/2019 | Greene et al. |
| 10,361,702 B2 | | 7/2019 | Greene et al. |
| 10,523,208 B2 | | 12/2019 | Hecht et al. |
| 10,714,180 B2 | | 7/2020 | McCollum et al. |
| 10,855,286 B2 | | 12/2020 | Greene et al. |
| 10,936,286 B2 | | 3/2021 | Greene et al. |
| 10,971,216 B2 | | 4/2021 | Greene et al. |
| 11,023,559 B2 | | 6/2021 | McCollum et al. |
| 2016/0246571 A1 | * | 8/2016 | Walters, III .............. G06F 7/5057 |
| 2016/0315619 A1 | * | 10/2016 | Fan .............. H03K 19/1732 |
| 2020/0019375 A1 | | 1/2020 | Pugh et al. |
| 2020/0150925 A1 | * | 5/2020 | Greene .............. H03K 19/00315 |

OTHER PUBLICATIONS

B. Khurshid and R. N. Mir, "High efficiency generalized parallel counters for look-up table based FPGAs," International Journal of Reconfigurable Computing, vol. 2015, Article ID 518272, 16 pages, 2015 (Year: 2015).

J. Hormigo, M. Ortiz, F. Quiles, F. J. Jaime, J. Villalba and E. L. Zapata, "Efficient Implementation of Carry-Save Adders in FPGAs," 2009 20th IEEE International Conference on Application-specific Systems, Architectures and Processors, pp. 207-210, 2009 (Year: 2009).

M. Kumm and P. Zimpf, "Efficient High Speed Compression Trees on Xilinx FPGAs," in Methoden und Beschreibungssprachen zur Modellierung und Verifikation von Schaltungen und Systemen (MBMV), pp. 171-182, 2014 (Year: 2014).

PCT/US2021/060229, International Search Report and Written Opinion, European Patent Office, dated May 9, 2022.

Thomas B Preusser et al, "Enhancing FPGA Device Capabilities by the Automatic Logic Mapping to Additive Carry Chains", Field Programmable Logic and Applications (FPL), 2010 International Conference on, IEEE, Piscataway, NJ, USA, Aug. 31, 2010 (Aug. 31, 2010), pp. 318-325.

Thomas B Preusser et al., "Mapping basic prefix computations to fast carry-chain structures", Field Programmable Logic and Applications (FPL) 2009 International Conference on, IEEE, Piscataway, NJ, USA, Aug. 31, 2009 (Aug. 31, 2009), pp. 604-608, p. 605, left-hand column, paragraph 3—p. 607, left-hand column, paragraph 5; figures 1,2.

Michael T Frederick et al, "Beyond the arithmetic constraint", FPGA 2008 : Sixteenth ACM/SIGDA International Symposium on Field-Programmable Gate Arrays, Feb. 24, 2008 (Feb. 24, 2008), pp. 37-46, XP058166147,DOI: 10.1145/1344671.1344679, ISBN: 978-1-59593-934-0, Monterey Beach Resort, Monterey, California, USA, Feb. 24-26, 2008, New York, NY : Association for Computing Machinery, US.

\* cited by examiner

| MODE | OUTPUT VALUES | | LOGIC CELL 190 CONFIG | |
|---|---|---|---|---|
| | S | CO | P | X |
| • Y IS ANY FUNCTION OF K INPUTS<br>• S OUTPUT UNUSED<br>• CI PROPAGATES UNCHANGED THROUGH TO CO | N/A | CI | 1 | Y |
| • Y IS ANY FUNCTION OF K INPUTS<br>• CI IS ROUTED TO S OUTPUT<br>• G IS AVAILABLE AT CO AND MAY BE USED TO INITIATE A NEW CARRY CHAIN STARTING IN NEXT CELL | CI | G | 0 | 0 |
| • IMPLEMENT ONE BIT OF AN ADDER WITH SUM = S<br>• CO IS THE CARRY OUT TO THE NEXT BIT OF THE SAME ADDER | XOR(Y, CI) | IF Y=1: CI<br>IF Y=0: G | Y | Y |
| • IMPLEMENT MOST SIGNIFICANT BIT OF AN ADDER WITH SUM = S<br>• G IS AVAILABLE AT CO AND MAY BE USED TO INITIATE A NEW CARRY CHAIN STARTING IN NEXT CELL | XOR(Y, CI) | G | 0 | Y |

FIG. 4

810 — PROVIDING K-INPUT LOOKUP TABLE (LUT) CIRCUITRY COMPRISING:
  i) A FIRST (K-1)-INPUT LUT AND A SECOND (K-1)-INPUT LUT BOTH SHARING IN COMMON SECOND THROUGH $K^{TH}$ INPUTS TO THE K-INPUT LUT, EACH OF THE FIRST AND SECOND (K-1)-INPUT LUTS HAVING AN OUTPUT, AND
  ii) A FIRST MULTIPLEXER HAVING A FIRST INPUT COUPLED TO THE OUTPUT OF THE FIRST (K-1)-INPUT LUT, A SECOND INPUT COUPLED TO THE OUTPUT OF THE SECOND (K-1)-INPUT LUT, AND A SELECT INPUT COUPLED TO A FIRST INPUT OF THE K-INPUT LUT CIRCUITRY, THE FIRST MULTIPLEXER PROVIDING A PRIMARY OUTPUT Y OF THE LOGIC CELL

[K IS ANY NON-NEGATIVE INTEGER. TYPICAL VALUES ARE K= 3, 4, 6]

820 — PROVIDING A CARRY CIRCUIT COUPLED TO RECEIVE A CARRY-IN (CI) INPUT AND TO GENERATE A CARRY-OUT (CO) OUTPUT AND A SUM (S) OUTPUT, WHEREIN THE CARRY-OUT OUTPUT IS SELECTIVELY INDEPENDENT OF Y, WHEREIN THE CARRY CIRCUIT COMPRISES:
  i) AN X MULTIPLEXER COUPLED TO PROVIDE AN OUTPUT SELECTED FROM ONE OF A CONSTANT LOGIC REFERENCE AND THE PRIMARY OUTPUT; AND
  ii) AN EXCLUSIVE-OR GATE PROVIDING THE SUM OUTPUT, WHEREIN THE EXCLUSIVE-OR GATE IS COUPLED TO RECEIVE THE OUTPUT OF THE X MULTIPLEXER AS A FIRST INPUT AND THE CARRY INPUT AS A SECOND INPUT

830 — GENERATING THE CARRY-OUT OUTPUT OF THE LOGIC CELL SELECTIVELY INDEPENDENT OF Y

840 — PROPAGATING THE CARRY-IN INPUT TO A SELECTED ONE OF THE CARRY-OUT OUTPUT AND THE SUM OUTPUT OF THE LOGIC CELL

FIG. 8

LOGIC CELL FOR PROGRAMMABLE GATE ARRAY

CROSS-REFERENCE TO RELATED APPLICATIONS

This application claims priority to U.S. Provisional Patent Application No. 63/191,774 filed on May 21, 2021, which is incorporated by reference in its entirety.

BACKGROUND

The present invention relates to logic circuits in user-programmable integrated circuits such as a field programmable gate array (FPGA). More particularly, the present invention relates to logic cell architecture for such programmable integrated circuits to provide improved support for compressors.

FPGAs are integrated circuits composed of logic cells connected by a programmable routing network. Typically, any logic cell output provided to the programmable routing network can be transmitted through the network to any logic cell input connected to the network. A common type of logic cell includes a K-input look-up table (LUT), multiplexers, and carry chain logic. Such a logic cell would have at least K inputs coming from the programmable routing network and a carry input coming from the carry output of a previous cell in a chain of logic cells.

One important property of an FPGA logic cell is how many of its inputs and outputs are provided by or to the programmable routing network. The versatility of a logic cell may increase as the number of inputs and outputs available from or to the programmable routing network increases but so does the complexity and cost of the FPGA. From a cost metric consideration, a logic cell architecture achieving desired functionality with fewer inputs and outputs required to be connected to the programmable routing network may be preferable to a different architecture that achieves the same functionality but requires more inputs and outputs to be connected to the programmable routing network.

Another important property of an FPGA logic cell is the number K of inputs to the LUT. The value K may range from 2 to 10 or more, but the most common values in practice are 3, 4 and 6. Some existing FPGAs use 3-input LUTs (K=3) or a 4-input LUT (K=4), which are best overall for low-cost, low-power FPGAs. Other existing FPGAs use a fracturable 6-input LUT (K=6). These can implement a wider variety of functions but consume more area and power. A more general way of defining K applicable to any logic cell is as the largest number such that for every function of K inputs, the logic cell can be configured to compute it.

FPGA logic cells may be used to form compressors. Compressors are a family of logic circuits that take multiple binary numerical values as inputs and produce their sum represented in fewer bits. For instance, the well-known full adder can also be referred to as a 3:2 compressor because it takes three one-bit inputs and produces a single bit sum and single bit carry-out output. (Collectively the two bits corresponding to the sum and carry-out indicate a count of the number of ones among the inputs). In some cases, compressors may be organized in a chain similar to a carry chain, with each compressor receiving one or more additional inputs from the previous compressor in the chain and generating the same number of additional outputs to the next compressor in the chain. An example is a 4:2 compressor.

Some prior art logic cell architectures require two logic cells to implement each 3:2 compressor: one to produce each of the two outputs. Other prior art logic cell architectures can implement a 3:2 compressor with a single logic cell at the cost of more required connections with the programmable routing network. A single logic cell architecture capable of implementing a 3:2 compressor with fewer required connections with the programmable routing network for power efficiency would be beneficial.

Some FPGA applications require large numbers of compressors. For example, binary neural networks are networks that quantize weights and activations with binary values instead of full precision values. Binary neural networks often require implementation of a function called "population count" or "pop count". This function represents the number of ones among a set of M Boolean inputs as a $\log_2(M)$-bit binary output value. Pop counters are typically implemented using many compressors.

BRIEF DESCRIPTION

According to an aspect of the present invention, a logic cell for a programmable logic integrated circuit apparatus is presented. The logic cell includes K-input lookup table (LUT) circuitry including: i) a first (K−1)-input LUT and a second (K−1)-input LUT both sharing in common second through Kth inputs to the K-input LUT, each of the first and second (K−1)-input LUTs having an output; and ii) a first multiplexer having a first input coupled to the output of the first (K−1)-input LUT, a second input coupled to the output of the second (K−1)-input LUT, and a select input coupled to a first input of the K-input LUT circuitry. The first multiplexer provides a primary output Y of the logic cell, wherein Y is any independent function of the K inputs. The logic cell includes a carry circuit with an X multiplexer coupled to provide an output selected from one of a constant logic reference and the primary output Y; and an exclusive-OR gate providing a sum output S, wherein the exclusive-OR gate is coupled to receive the output of the X multiplexer as a first input and a carry-input as a second input.

In one embodiment, the logic cell for a programmable logic integrated circuit includes a programmable routing network, wherein the K-input lookup table circuitry receives the K inputs from the programmable routing network, and wherein the programmable routing network receives the primary output and the sum output.

In one embodiment, the logic cell includes K-input lookup table circuitry for providing the primary output and a carry circuit coupled to receive one or more signals from the lookout table and a carry-in input and which provides a carry-out output and sum output. In one embodiment, the carry-in input is not received from the programmable routing network and the carry-out output is not provided to the programmable routing network. In one embodiment, the carry-in input is received from a previous logic cell in a chain of logic cells, and the carry-out output is provided to a subsequent logic cell in the chain.

In one embodiment the logic cell can be selectively configured to provide the value of the carry-in input at the carry-out output while also providing any function of the K inputs at the primary output.

In one embodiment, the logic cell can be selectively configured to provide the value of the carry-in input at the sum output while also providing any function of the K inputs at the primary output.

In one embodiment, the logic cell can be selectively configured to provide one bit of an adder with the sum appearing at the sum output and a carry appearing at the carry-out output. In one embodiment, the logic cell can be selectively configured to implement the final bit of a multi-bit adder with the sum appearing at the sum output and the carry-out output selectively driven to a pre-determined value (e.g., 0 or 1).

In various embodiments K≤4 such as K=3 or K=4. In another embodiment, K≥4 such as 4 or 6. K is not limited to these values and may be any non-negative integer value.

A method includes the step of a) providing K-input lookup table (LUT) circuitry comprising: i) a first (K−1)-input LUT and a second (K−1)-input LUT both sharing in common second through Kth inputs to the K-input LUT, each of the first and second (K−1)-input LUTs having an output, and ii) a first multiplexer having a first input coupled to the output of the first (K−1)-input LUT, a second input coupled to the output of the second (K−1)-input LUT, and a select input coupled to a first input of the K-input LUT circuitry, the first multiplexer providing a primary output Y of the logic cell. The method includes the step of b) providing a carry circuit coupled to receive a carry-in input (CI) and to generate a carry-out output (CO) and a sum output (S), wherein the carry-out output is selectively independent of Y, wherein the carry circuit comprises: i) an X multiplexer coupled to provide an output selected from one of a constant logic reference and the primary output; and ii) an exclusive-OR gate providing the sum output, wherein the exclusive-OR gate is coupled to receive the output of the X multiplexer as a first input and the carry-input as a second input. The method includes the step of c) generating the carry-out output selectively independent of Y, and d) propagating the carry-in input to a selected one of the carry-out output and the sum output of the logic cell.

BRIEF DESCRIPTION OF THE DRAWINGS

The present invention is illustrated by way of example and not limitation in the figures of the accompanying drawings in which like references indicate similar elements and in which:

FIG. 4 illustrates configuration settings for configuring the logic cell of FIG. 1 to accomplish stated functions;

FIG. 8 illustrates one embodiment of a method of configuring the logic cell illustrated in FIG. 1.

DETAILED DESCRIPTION

Persons of ordinary skill in the art will realize that the following description is illustrative only and not in any way limiting. Other aspects will readily suggest themselves to such skilled persons.

The present invention improves the efficiency of existing LUT-based FPGA logic cells at implementing accumulators and counters in conjunction in parallel with producing primary outputs which are a function of the LUT inputs.

Figure 1:
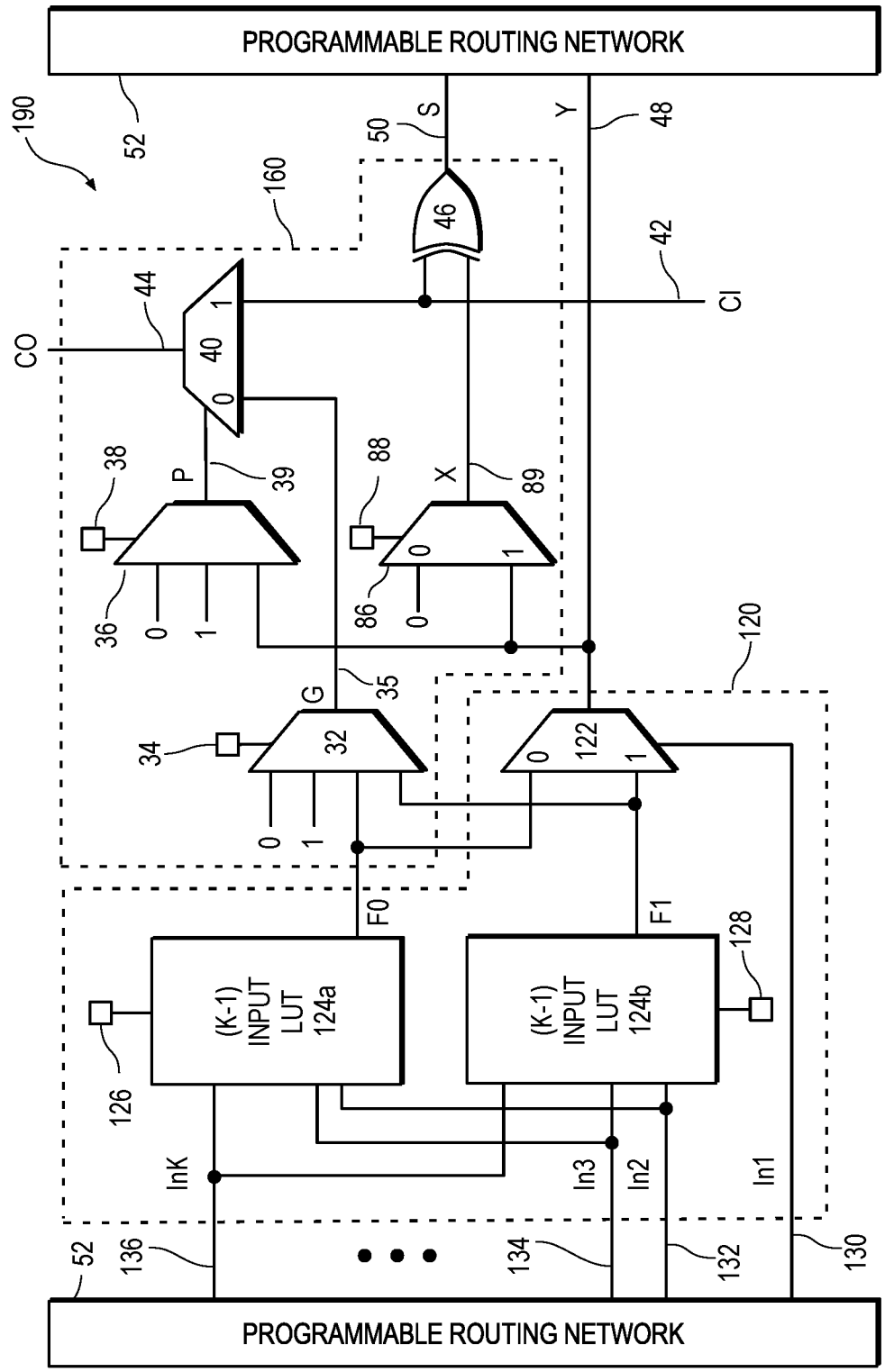
FIG. 1 is a block diagram of a logic cell in accordance with an aspect of the present invention.

In accordance with one aspect of the present invention, an illustrative LUT-based logic cell 190 that allows improved efficiency for counters and accumulators is shown in FIG. 1.

The logic cell 190 of FIG. 1 includes K-input LUT circuitry shown within dashed lines 120 formed from a first (K−1)-input LUT 124a and a second (K−1)-input LUT 124b. The small squares 126 and 128 represent configuration inputs used to define the functions of LUTs 124a and 124b respectively. Both LUTs 124a and 124b share in common the K−1 function inputs $In_2$, $In_3$, ... $In_K$ shown at reference numerals 132, 134, and 136, respectively. A first (2-input) multiplexer 122 ("Y multiplexer") has a first data input coupled to the output F0 of the first (K−1)-input LUT 124a, a second data input coupled to the output F1 of the second (K−1)-input LUT 124b, and a select input coupled to a function input $In_1$ at reference numeral 130 of the LUT 120. The data output of the Y multiplexer 122 serves as the output of the K-input LUT circuitry 120 and the primary output (Y) of the logic cell 190 as shown at reference numeral 48. In one particular instance of the present invention, K=4.

The logic cell 190 of FIG. 1 also includes a carry-in input CI 42, a carry-out output CO 44, and a sum output S 50. A carry circuit 160 in the logic cell 190 of FIG. 1 includes a second multiplexer ("G multiplexer") shown in FIG. 1 as a 4-input multiplexer 32 having a first data input coupled to the F0 output of the first K−1-input LUT 124a, a second data input coupled to the F1 output of the second K−1-input LUT 124b, a third data input coupled to a logic-high reference, a fourth data input coupled to a logic-low reference, and a data output denoted G. Select inputs shown as small square 34 coupled to configuration circuitry for the multiplexer 32 determine which one of the inputs of the G multiplexer 32 will be passed to its data output.

A third multiplexer ("P multiplexer") is shown in FIG. 1 as a 3-input multiplexer 36 in the carry circuit 160 of the logic cell 190. The P multiplexer 36 has a first data input coupled to the primary output, Y 48, of the K-input LUT circuitry 120 from the Y multiplexer 122, a second data input coupled to a logic-high reference, and a third data input coupled to a logic-low reference. Configuration circuitry 38 selects which one of the inputs of the P multiplexer 36 will be passed to its data output denoted P 39.

A fourth multiplexer, i.e. a carry-out multiplexer ("CO multiplexer"), is shown in FIG. 1 as a 2-input multiplexer 40 in the carry circuit 160 of the logic cell 190. The CO multiplexer 40 has a first data input coupled to the data output G 35 of the G multiplexer 32, a second data input coupled to the carry-in input CI 42 of the logic cell 190, a select input coupled to the output P 39 of the P multiplexer 36, and a data output coupled to provide the carry-out output CO 44 of the logic cell 190.

A fifth multiplexer 86 ("X multiplexer") in the carry circuit of the logic cell 190 has a first data input receiving the primary output, Y 48, of the first multiplexer 122 and a second data input coupled to a logic-low reference. Configuration circuitry 88 selects which one of the inputs of the X multiplexer will be passed to its data output denoted X 89.

An exclusive-OR gate 46 in the carry circuit 160 of the logic cell 190 has a first input coupled to receive the carry-in input CI 42, and a second input coupled to the data output X 89 of the X multiplexer 86. The output of the exclusive-OR gate is the sum output, S 50, of the logic cell 190.

In some implementations of the invention, either of the F0 or F1 inputs from LUTs 124a and 124b, and one of the logic reference inputs can be omitted from the G or P multiplexers (i.e., the second multiplexer 32 or third multiplexer 36). In various embodiments of a chain of logic cells, the carry circuitry of one or more consecutive logic cells may use a carry-lookahead, carry-select, or similar logic functionally equivalent to the carry function as illustrated in FIG. 1 but able to operate at increased speed.

The logic cell 190 of FIG. 1 has K function inputs and a carry-in input. The particular example shown in FIG. 1 includes K function inputs $In_1$ 130, $In_2$ 132, $In_3$ 134, through $In_K$ 136. To implement logic cells having larger values of K, additional function inputs driving both of LUTs 124a and 124b can be added. The primary output Y 48 of the logic cell 190 presents a value that is any function of the K−1 function inputs. A second output (the carry-out output CO 44) presents a value present on the carry-in input CI 42 or an output sourced by the second multiplexer 32 as selected by the output of the third multiplexer 36. The inputs $In_1$, $In_2$, $In_3$, ... $In_K$, and outputs S and Y are connected to the programmable routing network 52.

Figure 2:
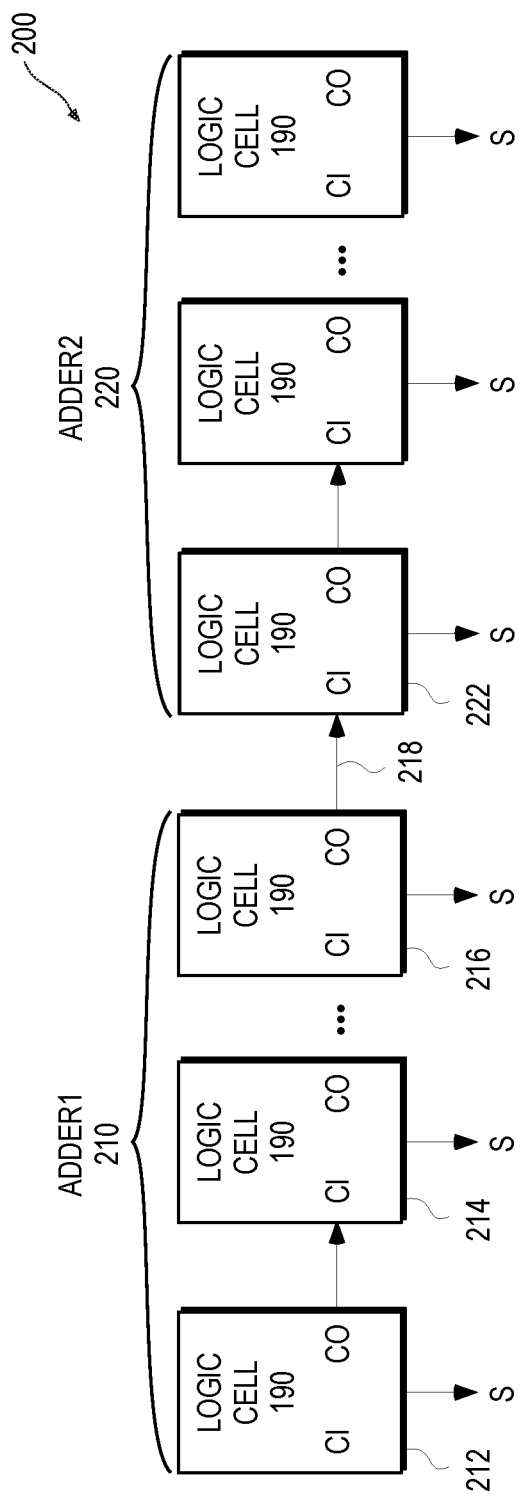
FIG. 2 illustrates two adders implemented using a chain of logic cells.

FIG. 2 illustrates a chain of logic cells such as logic cell 190 within an FPGA. The carry-out output (CO) of one logic cell directly drives the carry-in input (CI) of the next cell in the chain and neither CI nor CO needs to be connected to the programmable routing network. FIG. 2 also illustrates the use of a chain of logic cells to implement a pair of adders 200 including ADDER1 210 and ADDER2 220. The programmable routing network of FIG. 1 can be configured to place a plurality of logic cells such as logic cell 190 in a carry chain. Each adder is comprised of a plurality of consecutively-coupled logic cells in the carry chain. Each logic cell generates a corresponding sum bit S and a carry-out (CO) output signal to provide to the carry-in input (CI) of the next cell. For example, logic cell 212 includes a carry-in input CI, a sum output S, and a carry-out output CO coupled to the carry-in input CI of logic cell 214. The logic cell 216 associated with the most significant bit of ADDER1 210 produces an output S representing the most significant bit of ADDER1. Logic cell 216 also provides the proper CO signal 218 to the carry-in input of the logic cell corresponding to the least significant bit of ADDER2 220.

The configurations of the P, G, and X multiplexers may vary between the logic cell 212 associated with the least significant bit, the logic cell 216 associated with the most significant bit, and the logic cells such as 214 associated with the intermediate bits of ADDER1 210. The P, G, and X multiplexers are configured by the respective configuration circuitry 38, 34, 88, to ensure the proper signals are output by each logic cell within the adders. In particular, the X multiplexer of logic cells in adders is set to select Y so that the sum output S=EXOR(Y, CI), where "EXOR" is the Boolean exclusive OR function applied to the value set (Y, CI). In all but the last logic cell of an adder, the P multiplexer is set to select Y so that the carry-out output CO=CI, if Y=1 and CO=G if Y=0. This results in a ripple-carry chain propagating through the adder. However, in the last logic cell of an adder (such as logic cell 216 of ADDER1) the P multiplexer is configured to prevent the carry from propagating into the first logic cell of the next adder (such as logic cell 222 of ADDER2). In the last logic cell of an adder, the P multiplexer is set to select "0" so that CO=G and the G multiplexer is set to select either 0 or 1, whichever is the proper constant to initialize the carry chain of the next adder.

Figure 3:
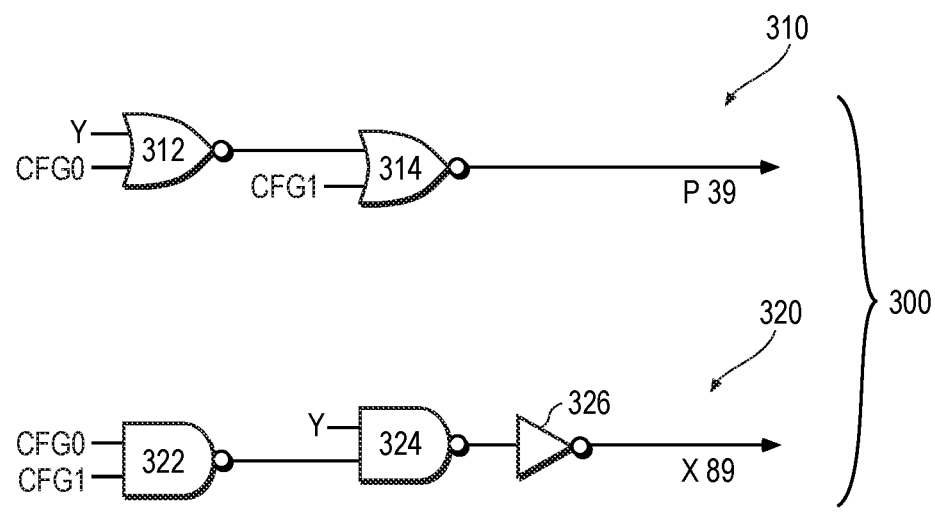
FIG. 3 illustrates one embodiment of the logic cell's P and X multiplexers and associated configuration circuitry in accordance with an aspect of the present invention.

FIG. 3 (with reference to FIG. 1) illustrates a combined implementation 300 of the, the P multiplexer (36) and its configuration circuitry (38) as circuitry 310 as well as the X multiplexer (86) and its configuration circuitry (88) as circuitry 320. Because the P multiplexer has three inputs and the X multiplexer has two inputs, there are six possible combinations of P and X multiplexer selections. However, only four out of the six possible combinations are of interest. These are listed in truth table 330 in FIG. 3. As a result the configuration circuitry for the P and X multiplexers can be implemented in as few as two configuration bits (CFG0 and CFG1) with the appropriate logic.

The P multiplexer and configuration circuitry 310 includes NOR gate 312 receiving the primary output Y and a first configuration bit, CFG0. NOR gate 312 is coupled to NOR gate 314. The output of NOR gate 312 is provided as one of the inputs to NOR gate 314. NOR gate 314 also receives a second configuration bit, CFG1. The output of NOR gate 314 is output P 39. The Boolean function for the P multiplexer and configuration circuitry 310 is P=((Y+CFG0)'+CFG1)' or any equivalent (wherein the apostrophe indicates logical negation).

The X multiplexer and configuration circuitry 320 includes NAND gate 322 which receives the two configuration bits, CFG0 and CFG1. NAND gate 322 is coupled to NAND gate 324. NAND gate 324 receives the output of NAND gate 322 and the primary output Y as inputs. NAND gate 324 is coupled to inverter gate 326 such that the output of NAND gate 324 is provided to inverter gate 326. The output of inverter gate 326 is output X 89. In the illustrated embodiment, NAND gate 324 is followed by inverter gate 326 to achieve an AND function. In an alternative embodiment, gate 324 is replaced with an AND gate to dispense with the need for the inverter gate 326. The Boolean function for the X multiplexer and configuration circuitry 320 is X=Y·(CFG0·CFG1)' or any logical equivalent (where the apostrophe indicates logical negation).

Truth table 330 illustrates the P 39 and X 89 outputs of the P multiplexer 36 and the X multiplexer 88, respectively of FIG. 1 based on the values of configuration bits CFG0 and CFG1 provided to the P multiplexer and configuration circuitry 310 and the X multiplexer and configuration circuitry 320.

FIG. 4 illustrates configuration settings for configuring the logic cell of FIG. 1 to accomplish the various modes illustrated in the first column of table 400. As indicated in the first row of table 400, the logic cell 190 of the present invention as illustrated in FIG. 1 can be configured to provide any function of K inputs as Y and to propagate CI unchanged through to CO (and leaving the S output unused), by setting the P multiplexer 36 so select 1 and the X multiplexer 86 to select Y.

As indicated in the second row of function table 400, the logic cell 190 of the present invention as illustrated in FIG. 1 can be configured to provide any function of K inputs at Y and to propagate CI to the S output. At the same time, the output of the G multiplexer is propagated to the CO output. This is accomplished by setting the P multiplexer 36 so select 0 and the X multiplexer 86 to select 0. This mode is useful if the next logic cell in the chain starts an adder (such as logic cell 222 in FIG. 2).

As indicated in the third row of function table 400, the logic cell 190 of the present invention as illustrated in FIG. 1 can be configured to implement one bit of an adder with S reflecting the sum and CO as the carry-out to the next more significant bit of the adder, by setting the P multiplexer 36 so select Y and the X multiplexer 86 to select Y.

As indicated in the fourth row of function table 400, logic cell 190 of FIG. 1 can be configured to implement the most significant bit of an adder with S reflecting the sum. At the same time, the output of the G multiplexer is propagated to the CO output. This is accomplished by setting the P multiplexer 36 so select 0 and the X multiplexer 86 to select Y. This is useful if the next logic cell in the chain starts another adder (such as logic cell 222 in FIG. 2).

Figure 5A:
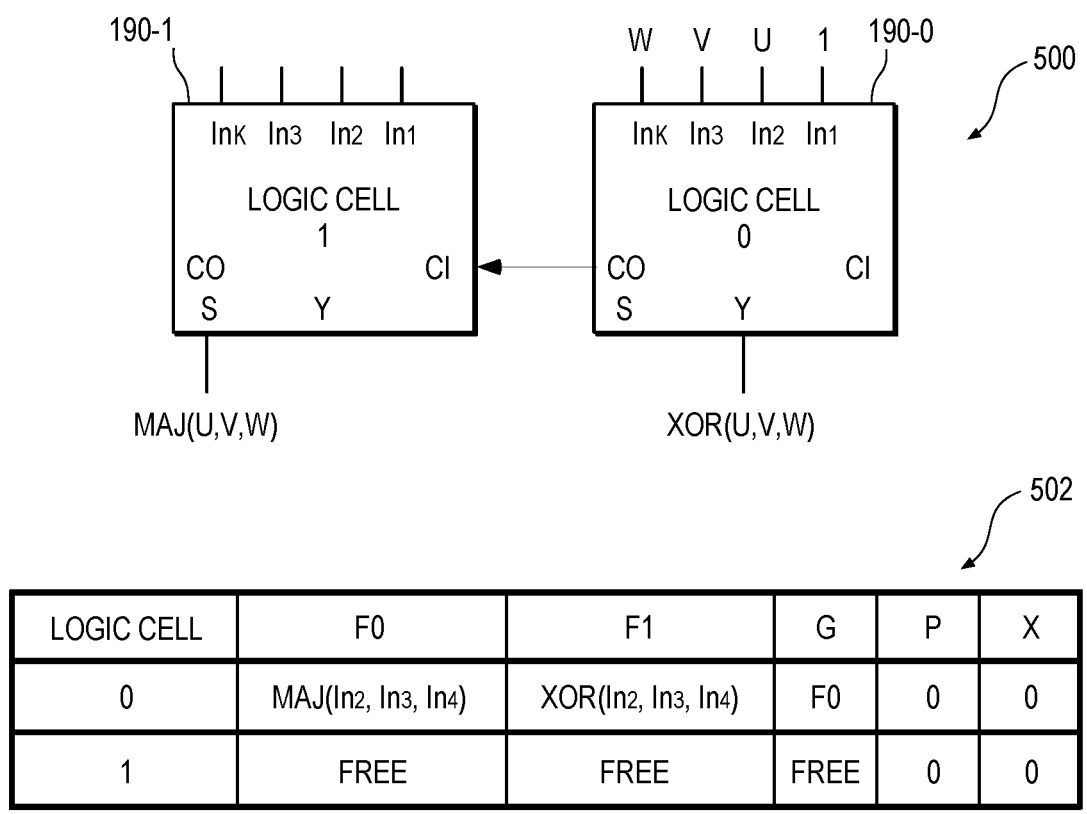
FIG. 5A is a block diagram of a 3:2 compressor implemented in accordance with an aspect of the present invention using the logic cell of FIG. 1.

FIG. 5A illustrates one embodiment of a 3:2 compressor 500 implemented using the logic cell 190 of FIG. 1. A properly implemented 3:2 compressor 500 receives three signals (U, V, W) from the programmable routing network, computes two new signals, EXOR(U,V,W) and MAJ(U,V,W), and sends them back out to the programmable routing network. The logic cells designated as "190-$n$" refer to instances of logic cell 190 of FIG. 1 where the value of "n" is used to distinguish between instances. In this example logic cell 190-0 is coupled to logic cell 190-1, with carry-out output CO of logic cell 190-0 coupled to the carry-in input CI of logic cell 190-1. No additional connection between CI or CO of either logic cell 190-0 or logic cell 190-1 and the programmable routing network is required. This ability can, for example, allow a more efficient implementation of compressors. In this embodiment, with reference also to FIG. 1, the LUT 124a of logic cell 190-0 is configured to provide F0=MAJ($In_2$, $In_3$, $In_4$) as indicated in table 502 of FIG. 5A. "MAJ" is the majority function. The majority function produces a single output from multiple inputs. The majority function produces a "1" when more than ½ of its inputs are "1" and otherwise produces a "0". The LUT 124b of logic cell 190-0 is configured to provide F1=XOR($In_2$, $In_3$, $In_4$) as indicated in table 502 of FIG. 5A. "XOR" refers to the Boolean exclusive or function which produces a "1" if and only if there are an odd number of inputs that are a "1" and otherwise produces a "0". As indicated in table 502, the G multiplexer 32 of logic cell 190-0 provides the F0 input at its respective data output G 35; the P multiplexer 36 of each of the logic cells 190-0 and 190-1 provides a logic low (i.e., 0) at its respective data output P 39; and the X multiplexer 86 of each of the logic cells 190-0 and 190-1 provides a logic low (i.e. 0) at its respective data output X 89. The LUTs 124a, 124b and the G multiplexer 32 of logic cell 190-1 are free for other uses, or may be configured as described in relation to logic cell 190-0 to implement the first cell of another independent 3:2 compressor, as next described in relation to FIG. 5B.

Figure 5B:
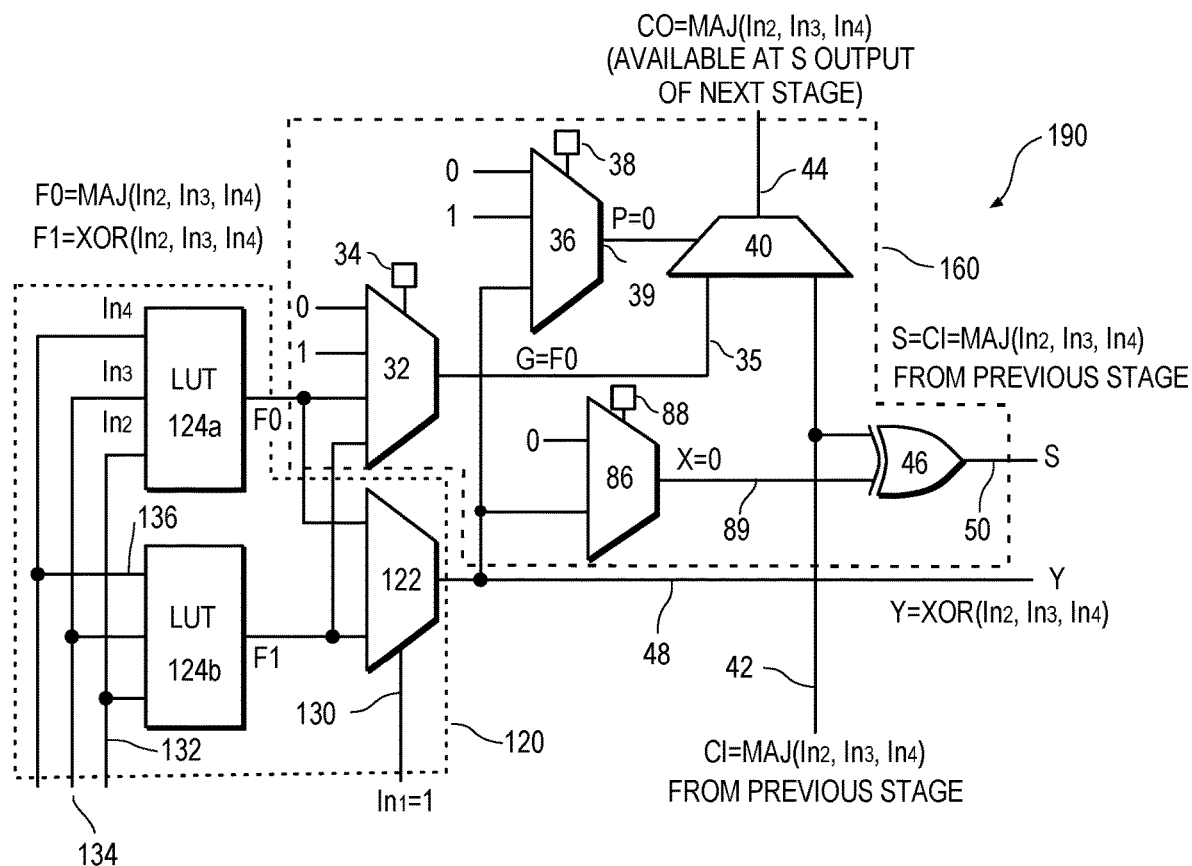
FIG. 5B is a detailed view of a 3:2 compressor implemented in accordance with an aspect of the present invention using the logic cell of FIG. 1.

FIG. 5B shows the internal details of how a single logic cell 190 can simultaneously implement the second stage (logic cell 190-1 in FIG. 5A) of one compressor and the first stage (logic cell 190-0 in FIG. 5A) of a second, independent compressor. The X multiplexer 86 is configured as described in relation to logic cell 190-1 of FIG. 5A to provide the value at the S output that is required for the second stage of the first compressor. The LUTs 124a and 124b, the P multiplexer 36, and the G multiplexer 32 are configured as described in relation to logic cell 190-0 of FIG. 5A to provide the values at the Y and CO outputs that are required for the first stage of the second compressor. In this way, M compressors can be implemented in M+1 logic cells. The incremental cost of a 3:2 compressor is thus only one logic cell 190.

Figure 6A:
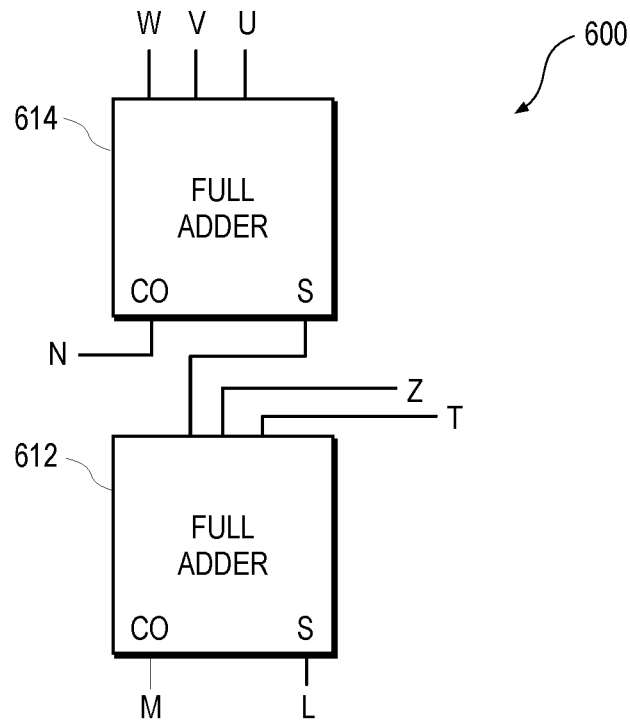
FIG. 6A is a functional block diagram of a 4:2 compressor.
Figure 6B:
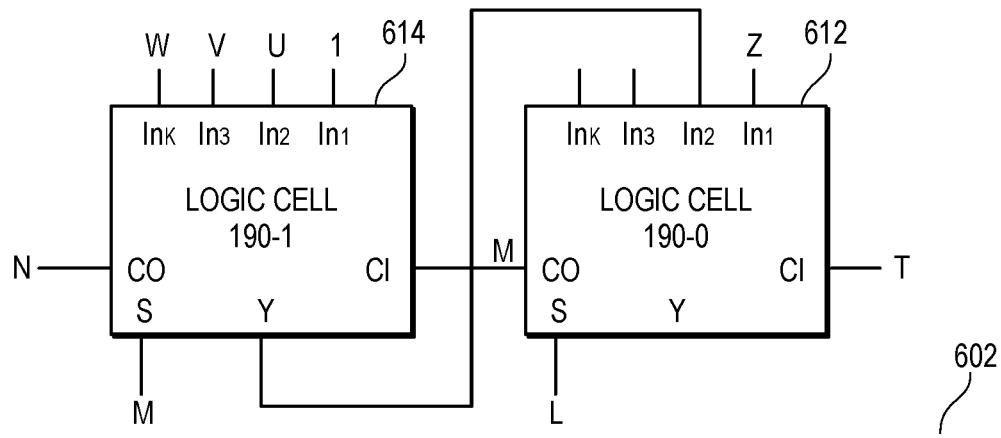
FIG. 6B is a block diagram of a 4:2 compressor implemented in accordance with an aspect of the present invention using the logic cell of FIG. 1.

Another example of the versatility of the logic cell 190 of FIG. 1 is shown in FIGS. 6A and 6B. FIG. 6A illustrates a block diagram of one embodiment of a 4:2 compressor 600 formed from full adders 612, 614 coupled together as shown, i.e., the S output 50 of full adder 614 is fed to one of the inputs of full adder 612. The W, V, and U inputs are fed to respective inputs of full adder 614, and the Z and T inputs are fed to respective input of full adder 612. The N output is provided from the CO output of full adder 614, the M output is provided from the CO output of full adder 612 and the L output is provided from the S output of full adder 612. Each full adder 612, 614 has three equivalent inputs and a sum and carry output. The compressor 600 is fed from inputs arbitrarily designated as inputs T, U, V, W, and Z. In practice, multiple instances of this compressor would be used, connected in a chain similar to a carry chain with the input T of one compressor driven by the output N of the previous compressor in the chain. FIG. 6B is a block diagram illustrating how only two logic cells 190-0 and 190-1 are required to implement adders 612, 614 to form the 4:2 compressor 600 of FIG. 6A. Table 602 shows the configuration of logic cells 190-0 and 190-1 to implement this function.

The top full adder 614 of FIG. 6A is implemented as logic cell 190-1 of FIG. 6B, with an additional pass-through function to be described below so as to be available to the programmable routing network. The lower full adder 612 is implemented in logic cell 190-0, including generation of the signal M which then passes through logic cell 190-1 from the CI input to the S output. With reference to FIG. 1, the LUT 124a of logic cell 190-0 is configured to generate F0=$In_2$. The LUT 124b of logic cell 190-0 is configured to generate F1=$In_2$! (where "!" designates logical negation) with the G, P, and X multiplexers set to select G=F0, P=Y, and X=Y. The LUT 124a of logic cell 190-1 is configured to generate F0=MAJ($In_2$, $In_3$, $In_4$). The LUT 124b of logic cell 190-1 is configured to generate F1=XOR($In_2$, $In_3$, $In_4$) with the G, P, and X multiplexers set to select G=F0, P=0, and X=0. The N output of one 4:2 compressor implemented using logic cells 190-0 and 190-1 can be used to drive the T input of another 4:2 compressor implemented using the next two logic cells in the carry chain.

Figure 7:
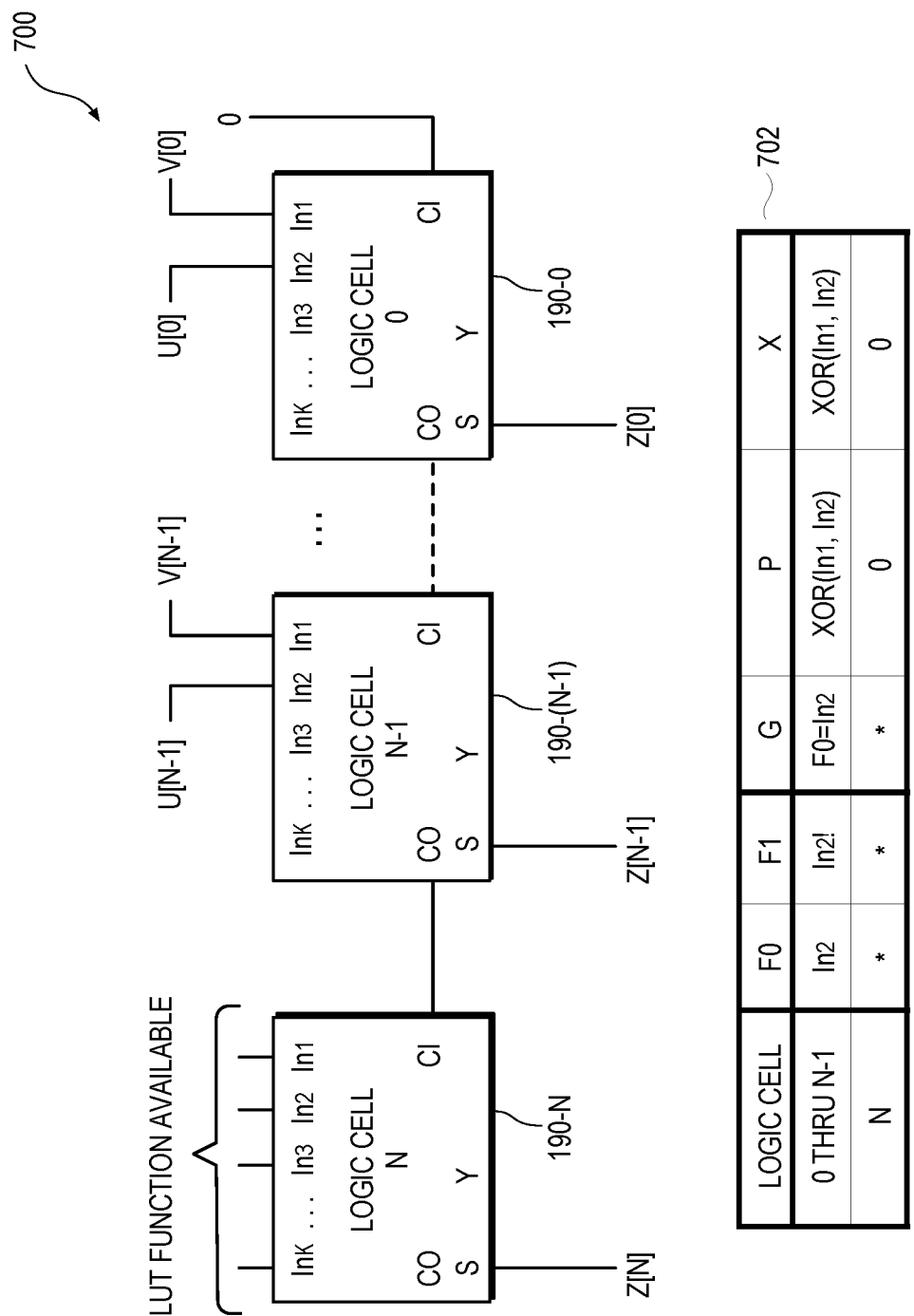
FIG. 7 is a block diagram of a 2-input adder implemented in accordance with an aspect of the present invention using the logic cell of FIG. 1.

FIG. 7 is a block diagram of a 2-input, N-bit adder 700 implemented in accordance with an aspect of the present invention using logic cells 190. The N-bit adder 700 employs N+1 logic cells shown as 190-0 through 190-N connected as shown. The CI input of the logic cell 190-0 is coupled to a constant logic low "0" level. The CO output of each logic cell 190-0 through 190-(N−1) is coupled to the CI input of the next logic cell 190 in the adder 700.

The $In_1$ and $In_2$ inputs of logic cells 190-0 through 190-(N−1) are coupled to the N operand inputs U[0] through U[N−1] and V[0] through V[N−1], respectively, for the adder 700. The S outputs of each logic cell 190-0 through 190-N form the sum outputs Z[0] through Z[N] for each of the N+1 output bits of the adder. The logic cell 190-N need only pass its carry-in (CI) input to its sum (S) output and on to the programmable routing network. Advantageously, this leaves its LUT available to implement in parallel any unrelated function of K inputs.

The table 702 in FIG. 7 shows the configuration of each of the logic cells in the adder 700. In particular, the look up tables of logic cells 190 indexed from 0 through N−1 (i.e., 190-0 through 190-(N−1)) are configured to compute F0=$In_2$ and F1=$In_2$!

FIG. 8 illustrates a method for implementing modes from the function table 400 of FIG. 4. The method includes the step 810 of providing K-input lookup table (LUT) circuitry comprising: i) a first (K−1)-input LUT and a second (K−1)-input LUT both sharing in common second through Kth inputs to the K-input LUT, each of the first and second (K−1)-input LUTs having an output, and ii) a first multiplexer having a first input coupled to the output of the first (K−1)-input LUT, a second input coupled to the output of the second (K−1)-input LUT, and a select input coupled to a first input of the K-input LUT circuitry, the first multiplexer providing a primary output Y of the logic cell. In various applications K≤4 such as 3 or 4. In other applications K≥6. Although typical values for K=3, 4, or 6 in various applications, K is not limited to these values. In general, K is any non-negative integer.

The method of FIG. 8 includes the step 820 of providing a carry circuit coupled to receive a carry-in input CI and to generate a carry-out output CO and a sum output S, wherein the carry-out output is selectively independent of Y, wherein the carry circuit comprises: i) an X multiplexer coupled to provide an output selected from one of a constant logic reference and the primary output Y; and ii) an exclusive-OR gate providing the sum output S, wherein the exclusive-OR gate is coupled to receive the output of the X multiplexer as a first input and the carry-in input as a second input. Step 830 includes generating the carry-out output CO selectively independent of Y, i.e., by setting P multiplexer 36 to 0, so as to have the CO output 44 reflect the data output G 35 irrespective of the value of Y, or to 1, so as to have the CO output 44 reflect the CI input 42, irrespective of the value of Y. The carry-out output CO is also selectively independent of CI, i.e., by setting P multiplexer 36 to 0, so as to have the CO output 44 reflect the data output G 35 irrespective of the value of CI. Step 840 includes configuring the X multiplexer to propagate the carry-in input as a selected one of the carry-out output and the sum output of the logic cell.

A logic cell for a programmable logic integrated circuit apparatus includes i) a K-input lookup table (LUT) circuit having a primary output Y and at least one additional output (F), such as F0 or F1 in FIG. 1; and ii) a carry circuit coupled to receive the outputs of the LUT and a carry-in input CI of the logic cell, wherein the carry circuit generates a sum output S and a carry-out output CO of the logic cell, and wherein the carry circuit can be configured in various ways. The example of FIG. 1 provides for the option of utilizing either F0 or F1 as an additional output, however this is not meant to be limiting. One way is to provide S=CI and to provide CO as a selected value from the set {0, 1, F}. The carry circuit can alternatively be configured to provide S=EXOR(Y, CI) and CO as a selected value from the set {0, 1, F}. The carry circuit can alternatively be configured to provide S=EXOR(Y, CI) and to provide CO=CI if Y=q and to provide CO as a selected value from the set {0, 1, F} if Y≠q, where q is a pre-determined value (e.g., such as 0 or 1).

While aspects and applications of this invention have been shown and described, it would be apparent to those skilled in the art that many more modifications than mentioned above are possible without departing from the inventive concepts herein.

What is claimed is:

1. A logic cell for a programmable logic integrated circuit apparatus, comprising:
   a K-input lookup table (LUT) circuitry comprising:
      a first (K−1)-input LUT and a second (K−1)-input LUT both sharing in common second through Kth inputs to the K-input LUT, each of the first and second (K−1)-input LUTs having an output;
      a first multiplexer having a first data input coupled to the output of the first (K−1)-input LUT, a second data input coupled to the output of the second (K−1)-input LUT, and a select input coupled to a first input of the K-input LUT circuitry, the data output of the first multiplexer providing a primary output of the logic cell, wherein the primary output is any independent function of the K inputs;
   a carry circuit comprising:
      a second multiplexer having respective data inputs coupled to the respective outputs of each of the first and second (K−1)-input LUTs, one or more data input coupled to receive one or more respective constant logic reference, a select input and a data output;
      a third multiplexer having a first data input coupled to the data output of the first multiplexer to receive the primary output, one or more data input coupled to receive one or more respective constant logic reference, a select input and a data output;
      a fourth multiplexer having a first data input coupled to the data output of the second multiplexer, a second data input to receive a carry-in input, a select input coupled to the data output of the third multiplexer and a data output providing a carry-out output of the logic cell,
      a fifth multiplexer having a first data input coupled to the data output of the first multiplexer, a second data input coupled to receive a constant logic reference, a select input and a data output; and
      an exclusive-OR gate having a first input to receive the carry-in input, a second input coupled to the data output of the fifth multiplexer, and an output providing a sum output of the logic cell.

2. The logic cell for a programmable logic integrated circuit apparatus of claim 1 wherein the sum output of the logic cell corresponds to one bit of an adder.

3. The logic cell for a programmable logic integrated circuit apparatus of claim 1,
   wherein the one or more data input of the second multiplexer coupled to receive one or more respective constant logic reference comprises a third data input coupled to receive a logic-high reference and a fourth data input coupled to receive a logic-low reference, and
   wherein the one or more data input of the third multiplexer coupled to receive one or more respective constant logic reference comprises a second data input coupled to receive a logic-high reference and a third data input coupled to receive a logic-low reference.

4. The logic cell for a programmable logic integrated circuit apparatus of claim 3, wherein the carry circuit includes a configuration circuitry coupled to the select input of the third multiplexer.

5. The logic cell for a programmable logic integrated circuit apparatus of claim 3, wherein the carry circuit includes a configuration circuitry coupled to the select input of the fifth multiplexer.

6. The logic cell for a programmable logic integrated circuit apparatus of claim 1 wherein K=3.

7. The logic cell for a programmable logic integrated circuit apparatus of claim 1 wherein K=4.

8. The logic cell for a programmable logic integrated circuit apparatus of claim 1 wherein K=6.

9. The logic cell for a programmable logic integrated circuit apparatus of claim 1 comprising:
   a programmable routing network, wherein the K-input lookup table circuitry receives the K inputs from the programmable routing network, wherein the programmable routing network receives the primary output of the logic cell and the sum output of the logic cell.

10. The logic cell for a programmable logic integrated circuit apparatus of claim 9 wherein the carry-in input is not received from the programmable routing network and wherein the carry-out output of the logic cell is not provided to the programmable routing network.

11. A logic cell comprising:
a K-input lookup table (LUT) circuitry comprising:
a first (K−1)-input LUT and a second (K−1)-input LUT both sharing in common second through Kth inputs to the K-input LUT, each of the first and second (K−1)-input LUTs having a respective output;
a first multiplexer having a first data input coupled to the output of the first (K−1)-input LUT, a second data input coupled to the output of the second (K−1)-input LUT, and a select input coupled to a first input of the K-input LUT circuitry, the first multiplexer providing a primary output of the logic cell; and
a carry circuit coupled to receive a carry-in input and to generate a carry-out output and a sum output, wherein the carry-out output is selectively independent of the primary output, wherein the carry circuit comprises:
a second multiplexer coupled to receive the respective outputs of each of the first and second (K−1) input LUTs;
a third multiplexer coupled to receive the primary output of the logic cell;
a fourth multiplexer coupled to provide one of an output of the second multiplexer and the carry-in input as the carry-out output in accordance with an output of the third multiplexer;
a fifth multiplexer coupled to provide an output selected from one of a constant logic reference and the primary output of the logic cell; and
an exclusive-OR gate providing the sum output, wherein the exclusive-OR gate is coupled to receive the output of the fifth multiplexer as a first input and the carry-in input as a second input.

12. The logic cell of claim 11 wherein the output of the third multiplexer is derived from a Boolean function of the primary output of the logic cell and two configuration bits, CFG0 and CFG1, wherein $$P=((Y+CFG0)'+CFG1)'.$$

13. The logic cell of claim 11 wherein the output of the fifth multiplexer is derived from a Boolean function of the primary output of the logic cell and two configuration bits, CFG0 and CFG1, wherein $$X=Y \cdot (CFG0 \cdot CFG1)'.$$

14. The logic cell of claim 11 comprising a programmable routing network, wherein the K-input lookup table circuitry receives the K inputs from the programmable routing network, wherein the programmable routing network receives the primary output of the logic cell and the sum output, wherein the carry-out output and the carry-in input are not connected to the programmable routing network.

15. The logic cell of claim 11 wherein the logic cell can be selectively configured to provide a value of the carry-in input as the carry-out output.

16. The logic cell of claim 11 wherein the logic cell can be selectively configured to provide a value of the carry-in input as the sum output.

17. The logic cell of claim 11 wherein the logic cell can be selectively configured to provide the primary output of the logic cell as any function of the K inputs.

18. The logic cell of claim 11 wherein $K \leq 6$.

19. A method, comprising the steps of:
providing a K-input lookup table (LUT) circuitry comprising:
a first (K−1)-input LUT and a second (K−1)-input LUT both sharing in common second through Kth inputs to the K-input LUT, each of the first and second (K−1)-input LUTs having an output; and
a first multiplexer having a first data input coupled to the output of the first (K−1)-input LUT, a second data input coupled to the output of the second (K−1)-input LUT, and a select input coupled to a first input of the K-input LUT circuitry, the first multiplexer providing a primary output of the logic cell; and
providing a carry circuit coupled to receive a carry-in input and to generate a carry-out output and a sum output wherein the carry circuit comprises:
a second multiplexer coupled to receive the respective outputs of each of the first and second (K−1) input LUTs;
a third multiplexer coupled to receive the primary output of the logic cell;
a fourth multiplexer coupled to provide one of an output of the second multiplexer and the carry-in input as the carry-out output in accordance with an output of the third multiplexer;
a fifth multiplexer coupled to provide an output selected from one of a constant logic reference and the primary output of the logic cell; and
an exclusive-OR gate providing the sum output, wherein the exclusive-OR gate is coupled to receive the output of the fifth multiplexer as a first input and the carry-in input as a second input;
generating a carry-out output selectively independent of the primary output of the logic cell; and
propagating the carry-in input to a selected one of the carry-out output and a sum output of the logic cell.

* * * * *